United States Patent
Tomimatu

(10) Patent No.: US 6,239,858 B1
(45) Date of Patent: May 29, 2001

(54) EXPOSURE METHOD, EXPOSURE APPARATUS AND SEMICONDUCTOR DEVICE MANUFACTURED BY USING THE EXPOSURE APPARATUS

(75) Inventor: Yoshikatu Tomimatu, Hyogo (JP)

(73) Assignee: Mitsubishi Denki Kabushiki Kaisha, Toyko (JP)

( * ) Notice: Subject to any disclaimer, the term of this patent is extended or adjusted under 35 U.S.C. 154(b) by 0 days.

(21) Appl. No.: 09/398,818

(22) Filed: Sep. 20, 1999

(30) Foreign Application Priority Data

Jun. 14, 1999 (JP) .................................................. 11-166303

(51) Int. Cl.[7] ........................... G03B 27/00; G03B 27/42; G03B 27/32; G01N 21/86; G03C 5/00
(52) U.S. Cl. ............................... 355/18; 355/53; 355/54; 355/77; 250/548; 430/311; 430/312
(58) Field of Search .................................. 355/18, 53, 54, 355/77; 250/548; 430/311, 312

(56) References Cited

U.S. PATENT DOCUMENTS 5,499,099 * 3/1996 Sato et al. ............................... 355/53
5,525,808 * 6/1996 Irie et al. ............................... 250/548
5,883,704 * 3/1999 Nishi et al. ............................... 355/67
6,018,395 * 1/2000 Mori et al. ............................... 355/53

FOREIGN PATENT DOCUMENTS 61-44429 3/1986 (JP) .

* cited by examiner

*Primary Examiner*—Russell Adams
*Assistant Examiner*—Khaled Brown
(74) *Attorney, Agent, or Firm*—McDermott, Will & Emery

(57) ABSTRACT

In an exposure method, using a first exposure apparatus including a reticle having an exposure pattern, a first pattern is formed on a resist film on a semiconductor substrate. Using a second exposure apparatus including a reticle having an exposure pattern identical with the aforementioned reticle, a second pattern is formed on the resist film having the first pattern. Based on error information between patterns obtained from the first and second patterns, non-linear error of the first exposure apparatus with respect to the non-linear error of the second exposure apparatus is calculated. Based on the information obtained by the correction data calculating step, the non-linear error of the second exposure apparatus is made equal to the non-linear error of the first exposure apparatus. By this step, it becomes possible to provide an exposure method, an exposure apparatus and a semiconductor device manufactured using the exposure apparatus which can be minimize the influence of non-linear error caused among exposure apparatuses, even when a plurality of exposure apparatuses are used.

10 Claims, 8 Drawing Sheets

FIRST EXPOSURE STEP (S10)

USING FIRST EXPOSURE APPARATUS INCLUDING A RETICLE HAVING A PRESCRIBED EXPOSURE PATTERN, A PRESCRIBED FIRST PATTERN IS FORMED ON A RESIST FILM ON A SILICON WAFER

SECOND EXPOSURE STEP (S20)

USING A SECOND EXPOSURE APPARATUS INCLUDING A RETICLE HAVING IDENTICAL EXPOSURE PATTERN, A SECOND PATTERN IS FORMED SUPERPOSED ON THE RESIST FILM ON WHICH THE FIRST PATTERN IS FORMED

CORRECTION DATA CALCULATING STEP (S30)

BASED ON ERROR INFORMATION BETWEEN PATTERNS OBTAINED FROM THE FIRST AND SECOND PATTERNS FORMED ON THE RESIST FILM ON THE SILICON WAFER, CORRECTION DATA, THAT IS, NON-LINEAR ERROR OF THE FIRST EXPOSURE APPARATUS WITH RESPECT TO THE NON-LINEAR ERROR OF THE SECOND EXPOSURE APPARATUS IS CALCULATED

NON-LINEAR ERROR CORRECTION STEP (S40)

BASED ON THE CORRECTION DATA OBTAINED IN CORRECTION DATA CALCULATING STEP, NON-LINEAR ERROR OF THE SECOND EXPOSURE APPARATUS IS MADE EQUAL TO THE NON-LINEAR ERROR OF THE FIRST EXPOSURE APPARATUS

FIG. 1

FIRST EXPOSURE STEP (S10)

> USING FIRST EXPOSURE APPARATUS INCLUDING A RETICLE HAVING A PRESCRIBED EXPOSURE PATTERN, A PRESCRIBED FIRST PATTERN IS FORMED ON A RESIST FILM ON A SILICON WAFER

SECOND EXPOSURE STEP (S20)

> USING A SECOND EXPOSURE APPARATUS INCLUDING A RETICLE HAVING IDENTICAL EXPOSURE PATTERN, A SECOND PATTERN IS FORMED SUPERPOSED ON THE RESIST FILM ON WHICH THE FIRST PATTERN IS FORMED

CORRECTION DATA CALCULATING STEP (S30)

> BASED ON ERROR INFORMATION BETWEEN PATTERNS OBTAINED FROM THE FIRST AND SECOND PATTERNS FORMED ON THE RESIST FILM ON THE SILICON WAFER, CORRECTION DATA, THAT IS, NON-LINEAR ERROR OF THE FIRST EXPOSURE APPARATUS WITH RESPECT TO THE NON-LINEAR ERROR OF THE SECOND EXPOSURE APPARATUS IS CALCULATED

NON-LINEAR ERROR CORRECTION STEP (S40)

> BASED ON THE CORRECTION DATA OBTAINED IN CORRECTION DATA CALCULATING STEP, NON-LINEAR ERROR OF THE SECOND EXPOSURE APPARATUS IS MADE EQUAL TO THE NON-LINEAR ERROR OF THE FIRST EXPOSURE APPARATUS

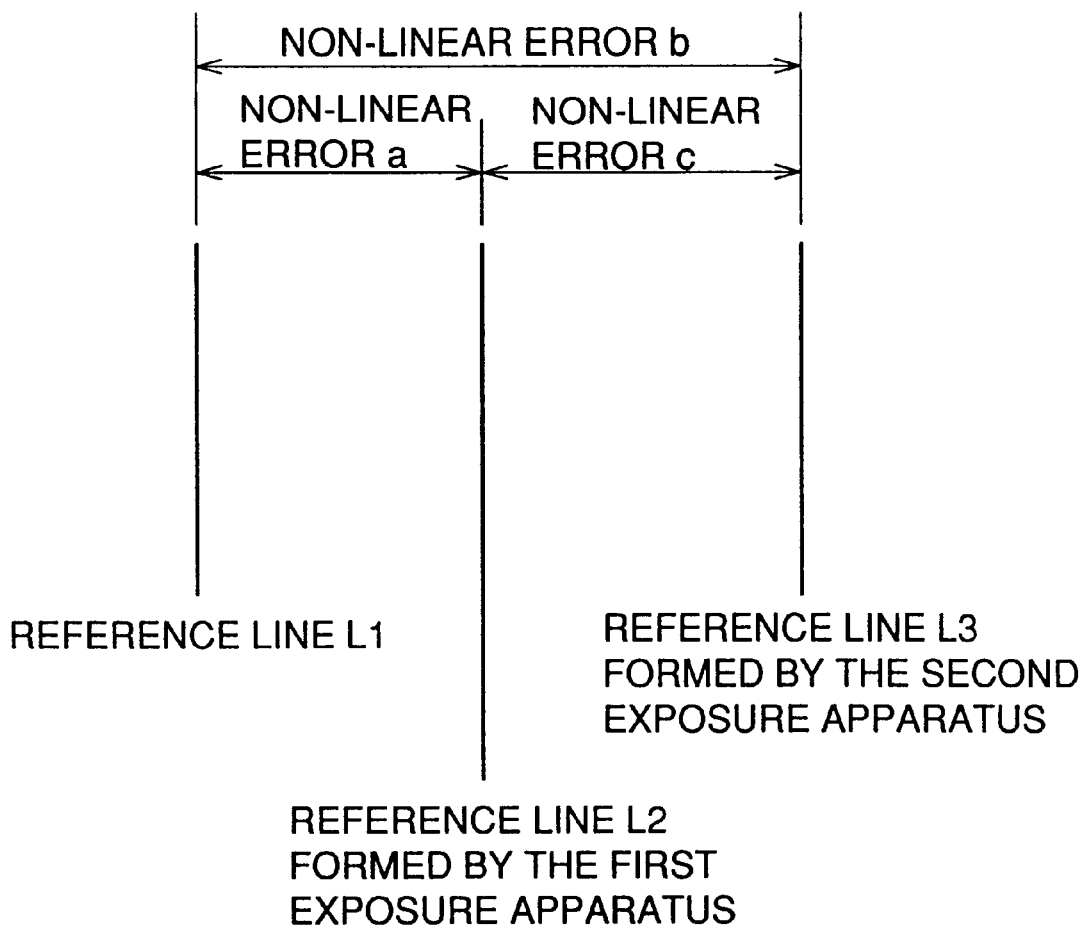

EXPOSURE METHOD, EXPOSURE APPARATUS AND SEMICONDUCTOR DEVICE MANUFACTURED BY USING THE EXPOSURE APPARATUS

BACKGROUND OF THE INVENTION

1. Field of the Invention

The present invention relates to an exposure method, an exposure apparatus and a semiconductor device manufactured by using the exposure apparatus. More specifically, the present invention relates to an exposure apparatus capable of reducing stage matching error, which is a registration error generated when a plurality of exposure apparatuses are used, and to a semiconductor device manufactured by using the exposure method.

2. Description of the Background Art

Conventionally, an apparatus called a stepper has been known as an exposure apparatus used for manufacturing a semiconductor device. In the stepper, a semiconductor wafer is moved stepwise in X-Y direction below a projection lens, while an exposure pattern image formed on a reticle is reduced by the projection lens and the image is exposed successively on each shot area of one semiconductor wafer.

Various methods for improving registration accuracy have been employed for the stepper. An alignment method disclosed in Japanese Patent Laying-Open No. 61-44429, for example, has been known as a method of improving registration accuracy.

The aforementioned alignment method disclosed in Japanese Patent Laying-Open No. 61-44429 will be described with reference to FIG. 9. FIG. 9 is a schematic flow chart of an exposure sequence using EGA (Enhanced Global Alignment) method described in Japanese Patent Laying-Open No. 61-44429.

Referring to FIG. 9, a semiconductor wafer is subjected to pre-alignment, using an orientation flat of the semiconductor wafer (step D10).

Thereafter, using a WGA (Wafer Global Alignment) mark formed in each shot area, the semiconductor wafer is rotated for correction (step D11).

Thereafter, a stage on which the semiconductor wafer is mounted is moved in accordance with a design value of chip arrangement, and for a plurality of shot areas selected in advance for error detection, an LSA alignment mark position of print pattern is detected by an LSA (Laser Step Alignment) optical system (actually measured value). At the same time, the position of the wafer stage is detected by a laser interferometer (design value).

Based on the detected actual measured value and the design value, registration error between the print pattern on the semiconductor wafer and the reticle pattern image is detected (step D12).

Thereafter, based on the design value and the actually measured value, error parameter is determined by least square method. More specifically, registration error in each shot area and deviation from a position coordinate (coordinate of the print pattern) on the wafer stage are found. An average value of the deviation is calculated as a correction value (error parameter) (step D13).

Using the error parameter and the design value, a chip arrangement map is formed in which rotation error, perpendicularity, base line error and scaling error in each shot area are corrected (step D14).

Thereafter, in accordance with the chip arrangement map, the wafer stage is positioned by step and repeat method (step D15). Thereafter, each shot area is exposed (step D16).

The exposure method using the EGA method described above utilizes four correction values (error parameters), that is, base line correction, rotation correction, perpendicularity correction and scaling correction. An exposure pattern is obtained with registration accuracy improved by using these four correction values.

Now, in the exposure method based on the EGA method using the aforementioned four correction values, the errors to be corrected are linear errors experienced when the semiconductor wafer is placed on the wafer stage. When first and second exposure steps are performed by one exposure apparatus, non-linear errors inherent to the exposure apparatus including an error derived from distortion of an interference mirror and peculiar tendency of travel of the stage do not cause any problem, as such errors are cancelled.

When the exposure steps are performed by using a plurality of exposure apparatuses, non-linear errors of the exposure apparatuses differ apparatus by apparatus. Accordingly, the non-linear errors cannot be cancelled among the exposure apparatuses, resulting in lower registration accuracy.

SUMMARY OF THE INVENTION

An object of the present invention is to provide an exposure method, an exposure apparatus and a semiconductor device manufactured by using the exposure apparatus which can reduce as much as possible an influence of non-linear error generated among exposure apparatuses, even when a plurality of exposure apparatuses are used.

The exposure apparatus and the exposure method in accordance with the present invention are used for manufacturing a semiconductor device, and the present invention includes a step of correction for equalizing non-linear error of the exposure apparatus with non-linear error of another exposure apparatus.

As the step of correction is included, influence of non-linear error generated among exposure apparatuses can be minimized, even when a plurality of exposure apparatuses are used.

As a result, lowering of registration accuracy experienced when a plurality of exposure apparatuses are used can be prevented. Further, extensive operation of one exposure apparatus is avoided, non-operation or idling of other exposure apparatuses is avoided, possible delay in developing products caused by failure or malfunction of an exposure apparatus is prevented, considerable cost can be reduced when the exposure apparatus is installed in a plant, and accordingly, manufacturing cost of the semiconductor device can be reduced.

In order to implement the present invention in a more preferable state, the above described step of correction includes: a first exposure step of forming a prescribed first pattern on a resist film on a semiconductor substrate by using the aforementioned another exposure apparatus including a reticle with a prescribed exposure pattern; a second exposure step of forming a second pattern on the resist film having the first pattern, using the aforementioned exposure apparatus itself including the reticle with the same exposure pattern; a correction data calculating step of calculating linear error of the aforementioned another exposure apparatus with respect to non-linear error of the aforementioned exposure apparatus itself, based on error information between patterns obtained from the first and second patterns; and a non-linear error correcting step, based on the information obtained by the correction data calculation, of making the non-linear error of the aforementioned exposure apparatus itself equal to the non-linear error of the aforementioned another exposure apparatus.

Further, for higher accuracy of the correction step, the first exposure step has a first shot area exposure step of exposing the first pattern on respective ones of matrix-shaped shot areas arranged in m rows×n columns (m, n are integers) on a resist film of the silicon wafer, the second exposure step has a second shot area exposure step of exposing the second pattern on each of the m×n shot areas, and the correction data calculation step has averaging step of calculating the amount of misalignment between the first and second patterns formed on a selected plurality of shot areas, and calculating an average amount of misalignment of each shot area.

For higher efficiency of the correction step, four shot areas approximately at the center among m×n shot areas are selected in the averaging step.

For higher precision of the correction step, the first and second patterns are formed on m×n shot areas of each of at least ten semiconductor substrates.

According to the present invention, the semiconductor device is manufactured using at least two exposure apparatuses, one of which has a correction step for making non-linear error of one exposure apparatus equal to non-linear error of another exposure apparatus.

As the correction step is provided, influence of the non-linear error generated among exposure apparatuses on the semiconductor device can be minimized, even when a plurality of exposure apparatuses are used.

As a result, degradation of registration accuracy when a plurality of exposure apparatuses are used can be prevented. Further, extensive operation of one exposure apparatus can be avoided, non-operation or idling of other exposure apparatuses can be avoided, possible delay in product development caused by malfunction or failure of an exposure apparatus can be prevented, significant cost can be reduced when an exposure apparatus is installed in a plant, and hence manufacturing cost of the semiconductor device can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a flow chart representing a correction step in accordance with an embodiment of the present invention.

FIG. 2 is a schematic illustration representing correction of non-linear error.

DESCRIPTION OF THE PREFERRED EMBODIMENTS

Figure 3:
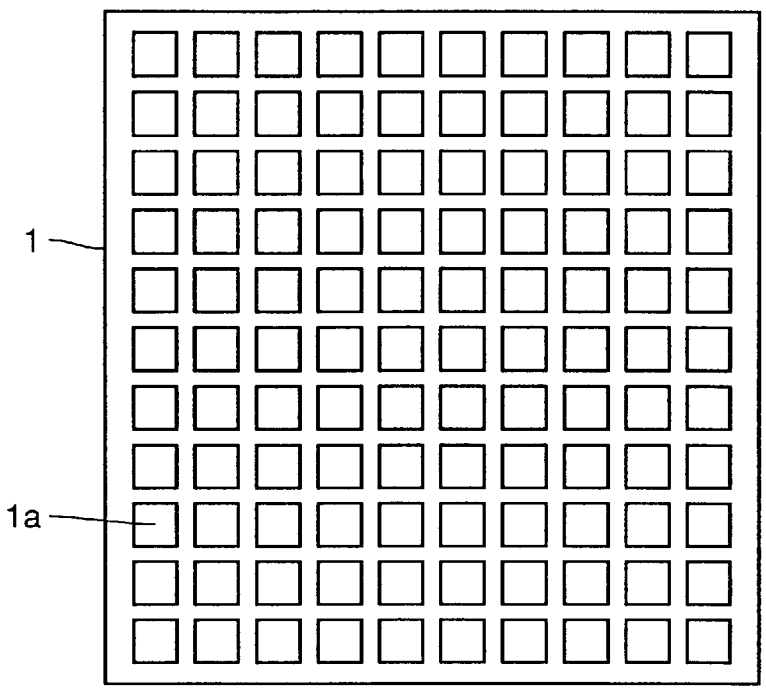
FIG. 3 is a plan view representing a mark arrangement in accordance with an embodiment of the present invention.

The exposure apparatus, the exposure method and the semiconductor device manufactured by using the exposure apparatus, in accordance with the embodiments of the present invention will be described with reference to the figures.

First, the exposure apparatus and the exposure method in accordance with an embodiment minimize influence of non-linear error generated among exposure apparatuses, even when a plurality of exposure apparatuses are used in the steps of manufacturing a semiconductor device.

An exposure apparatus used in the steps of manufacturing a semiconductor device includes a linear error and a non-linear error. The linear error refers to base line error, rotation error, perpendicularity, scaling error and so on, which are generated when the semiconductor wafer is mounted on the exposure apparatus. The non-linear error refers to error derived from distortion of an interference mirror, an error caused by peculiar traveling tendency of the stage and so on, that is, errors inherent to the exposure apparatus.

When steps of exposure are successively performed using a plurality of exposure apparatuses, linear errors can be corrected apparatus by apparatus. The non-linear errors, however, cannot be corrected as the errors are inherent to the exposure apparatuses, and therefore stage matching error results after every step of exposure, as the non-linear error is included in the exposure pattern. Therefore, in the present embodiment, a correction step is provided, for making the non-linear errors of the plurality of exposure apparatuses equal with each other.

Assume, for example, two exposure apparatuses, that is, a first exposure apparatus and a second exposure apparatus. The first exposure apparatus has inherent non-linear error a, while the second exposure apparatus has an inherent non-linear error b. In order to equalize the non-linear errors of the first and second exposure apparatuses, it is possible to use a method of correction in which the non-linear error b of the second exposure apparatus is made equal to non-linear error a of the first exposure apparatus, or it is possible to use a method of correction in which non-linear error b of the second exposure apparatus and non-linear error a of the first exposure apparatus are both adjusted so that the errors a and b attain to a prescribed non-linear error d (namely, both non-linear errors b and a are set to non-linear error d). As an example, the correction step in which the non-linear error b of the second exposure apparatus is made equal to the non-linear error a of the first exposure apparatus, that is, the former method, will be described with reference to FIG. 1.

(Correction Step)

As the first exposure step (S10), using a first exposure apparatus ("another" exposure apparatus) including a reticle of a prescribed exposure pattern, a prescribed first pattern is formed on a resist film on a semiconductor substrate.

As the second exposure step (S20), using a second exposure apparatus (exposure apparatus itself) including a reticle having the same exposure pattern as the aforementioned reticle, a second pattern is formed overlapping on the resist film having the first pattern.

As a correction data calculating step (S30), based on error information between patterns obtained from the first and second patterns, correction data, which is the non-linear error of the first exposure apparatus with respect to the non-linear error of the second exposure apparatus, is found.

For example, when a reference line exposed by using the first exposure apparatus is represented as L2, with respect to a reference line L1 as shown in FIG. 2, the non-linear error of the first exposure apparatus can be represented as non-linear error a, which is the amount of misalignment of reference line L2 from reference line L1.

Similarly, when a reference line exposed by using the second exposure apparatus is represented as L3, the non-linear error of the second exposure apparatus can be represented as non-linear error b, which is the amount of misalignment of reference line L3 from reference line L1. For convenience of description, it is assumed that linear errors of the first and second exposure apparatuses have been corrected.

From the non-linear error a of the first exposure apparatus and the non-linear error b of the second exposure apparatus obtained in the above described manner, non-linear error c as correction data, which is the non-linear error of the first exposure apparatus with respect to the non-linear error of the second exposure apparatus, can be obtained.

Thereafter, as a non-linear error correcting step (S40), based on the information (non-linear error c) obtained in the correction data calculating step (S30), the non-linear error of the second exposure apparatus is made equal to the non-linear error of the first exposure apparatus. For example, by subtracting the non-linear error c from the non-linear error b of the second exposure apparatus, it is possible to make the non-linear error b of the second exposure apparatus equal to the non-linear error a, that is, equal to the non-linear error of the first exposure apparatus.

(Specific Implementation)

Specific implementation of the correction step represented by steps S40 above, will be described with reference to FIGS. 3 to 7.

(Step 1)

First, referring to FIG. 3, an example will be described in which a prescribed pattern is exposed in accordance with a mark arrangement 1 in which shot areas 1a are arranged in a matrix of 10 rows×11 columns, using the first exposure apparatus.

Figure 4:
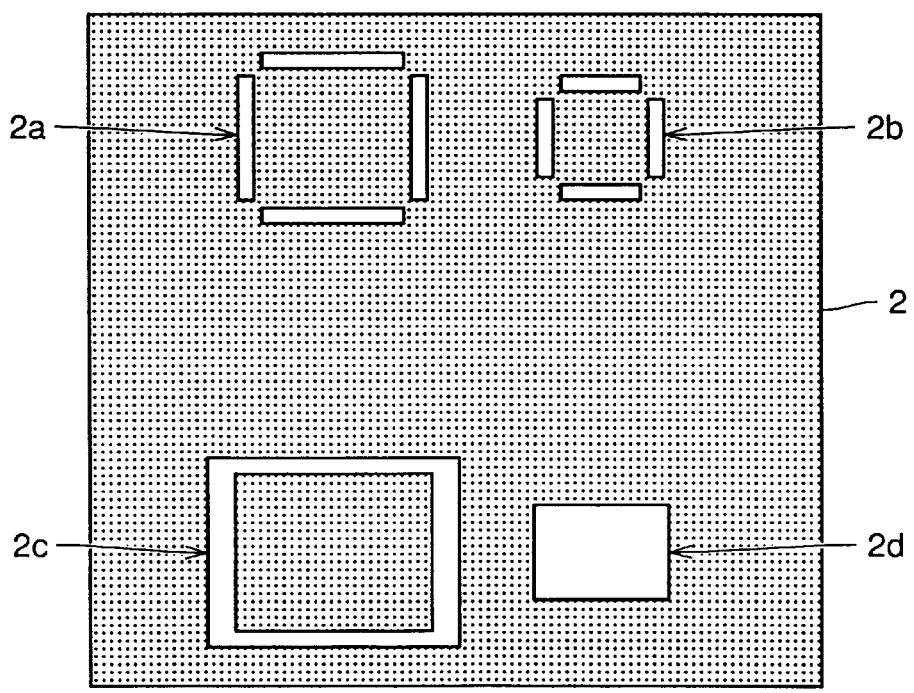
FIG. 4 is a plan view of a pattern formed on a reticle mask in accordance with an embodiment of the present invention.

An exposure pattern 2 provided on the reticle mask attached to the first exposure apparatus has box in box type exposure patterns 2a to 2d, as can be seen from FIG. 4. In accordance with the mark arrangement 1 of FIG. 3 (here it is assumed that the size of shot area 1a is one half the shot size of the semiconductor device to be developed), exposure is performed using the first exposure apparatus, on which the reticle mask of the exposure pattern shown in FIG. 4 is mounted, successively.

As to the manufacturing process of the semiconductor wafer, common photolithography technique is utilized, a resist film is applied to a silicon wafer, and the first exposure in accordance with the mark arrangement 1 described above is performed. Thereafter, the resist film is developed, and a resist film having the prescribed first pattern in accordance with the mark arrangement 1 is formed (in FIG. 7, step 1).

The arrangement of the shot areas 1a is not limited to 10 rows×11 columns. The shot areas are arranged in a matrix of m rows×n columns (where m and n are integers). Preferably, shot area 1a has a shot area size of 1 mm×1 mm, and preferably, the matrix may be up to 18 rows×18 columns.

(Step 2)

Thereafter, using the second exposure apparatus, general exposure of the silicon wafer having the resist film with the first pattern formed is performed. More specifically, alignment mark for exposure is detected from the resist film having the first pattern formed on the silicon wafer, and by a prescribed method of analysis, arrangement case of the alignment mark for exposure is detected.

Based on the arrangement case, using a reticle mask 2 having exposure patterns 2a to 2d of box-in-box type similar to those described above, offset is provided so that the exposure alignment mark formed by the first exposure apparatus overlaps the exposure alignment mark formed in the reticle mask. The offset is adjusted such that exposure pattern 2b overlapped exposure pattern 2a and exposure pattern 2d overlaps exposure pattern 2c, respectively.

Figure 5:
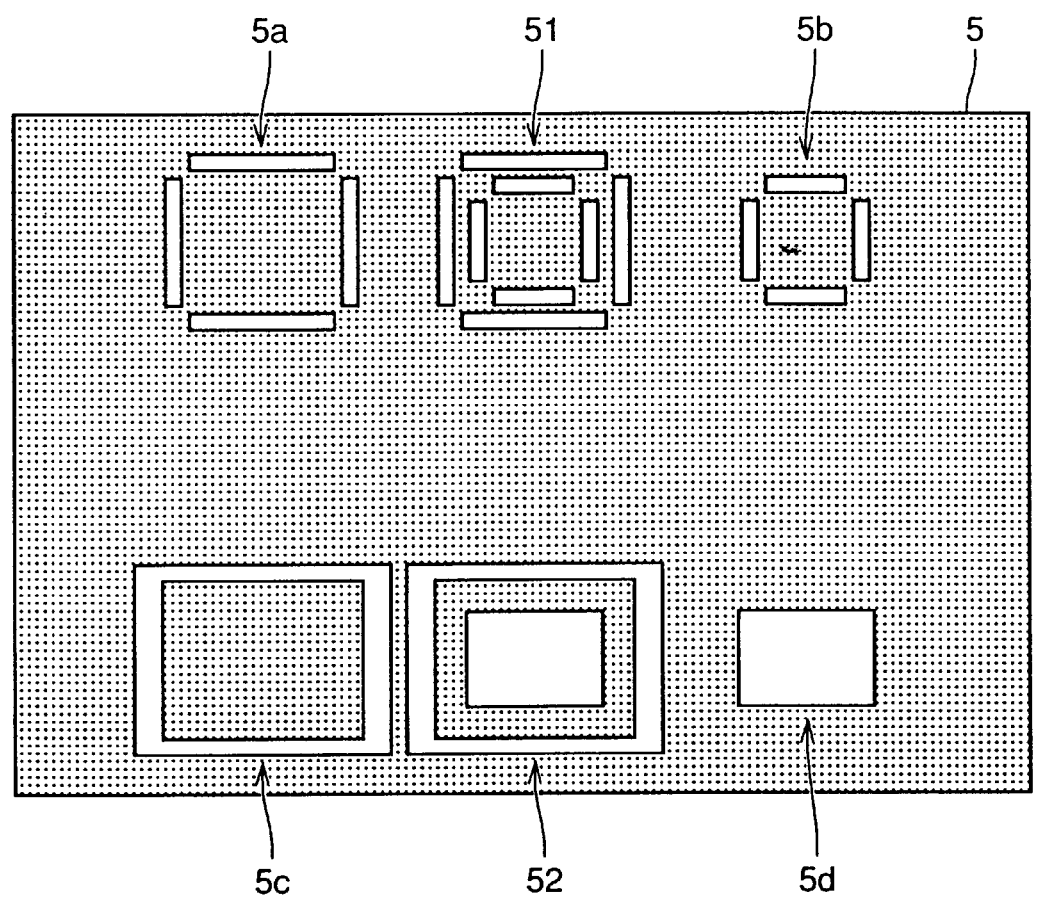
FIG. 5 is a plan view of a resist pattern in accordance with an embodiment of the present invention.
Figure 6:
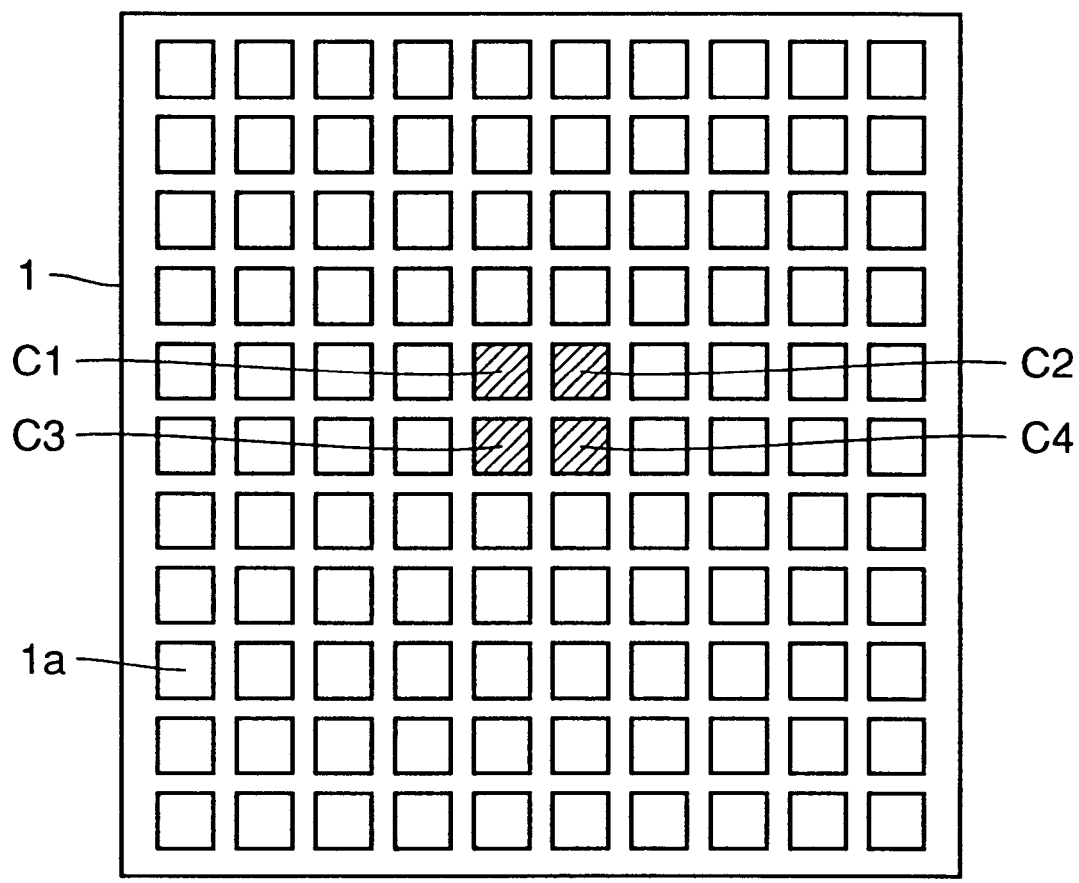
FIG. 6 is a plan view representing central four points of mark arrangement in an embodiment of the present invention.

Thereafter, in the similar manner as in step 1, every shot area 1a is subjected to the second exposure, and thereafter the resist film is developed. Thus, the resist film having the second pattern overlapped on the first pattern is formed (in FIG. 7, step 2). Thus, on the silicon wafer, a resist film 5 having the pattern shown in FIG. 5 is formed.

The pattern formed on resist film 5 includes a pattern 5a corresponding to exposure pattern 2a, a pattern 5b corresponding to exposure pattern 2b, a pattern 5c corresponding to exposure pattern 2c, a pattern 5d corresponding to exposure pattern 2d, a pattern 51 formed by exposure patterns 2b and 2a overlapped with each other, and a pattern 52 formed by exposure patterns 2d and 2c overlapped with each other.

Thereafter, the above described exposure steps 1 and 2 are performed on at least ten silicon wafers, so as to fabricate at least ten silicon wafers for obtaining data. The number of silicon wafers is determined to improve data reliability. If operational stability of the first and second exposure apparatus used is not satisfactory, it is possible to further increase the number of silicon wafers to improve reliability, considering variation of the measured data.

(Step 3)

Thereafter, referring to FIG. 5, using pattern 52 formed on resist film 5 on which registration exposure is performed, the amount of offset misalignment between the first and second patterns is measured by misalignment inspecting apparatus. The measurement is made by calculating an amount of misalignment (error information between patterns) of shot areas 1a at the central four points C1 to C4. The measurement of the amount of misalignment is performed for the ten silicon wafers (in FIG. 7, step 3).

(Step 4)

Thereafter, the measured amount of misalignment (error information between patterns) is processed to calculate correction data.

More specifically, first an average value of the data of the amount of misalignment in shot areas 1a at the central four points C1 to C4 described above is calculated for each of the ten silicon wafers. Second, by using a general method of analysis, linear error is removed from the average value of the data of the amount of misalignment obtained for each silicon wafer, and the amount of misalignment (shot data) of each silicon wafer is calculated.

Third, in order to improve reliability of each amount of misalignment (shot data) obtained for the ten silicon wafers, determination of three times S.T.D. (standard deviation) is performed. This is to verify relevance of the amount of misalignment (shot data) of each of the measured ten silicon wafers. The standard to be employed as the amount of misalignment (shot data) should be at most 5 nm in terms of three times S.T.D. (10% registration accuracy when one same exposure apparatus is used as a reference).

Figure 7:
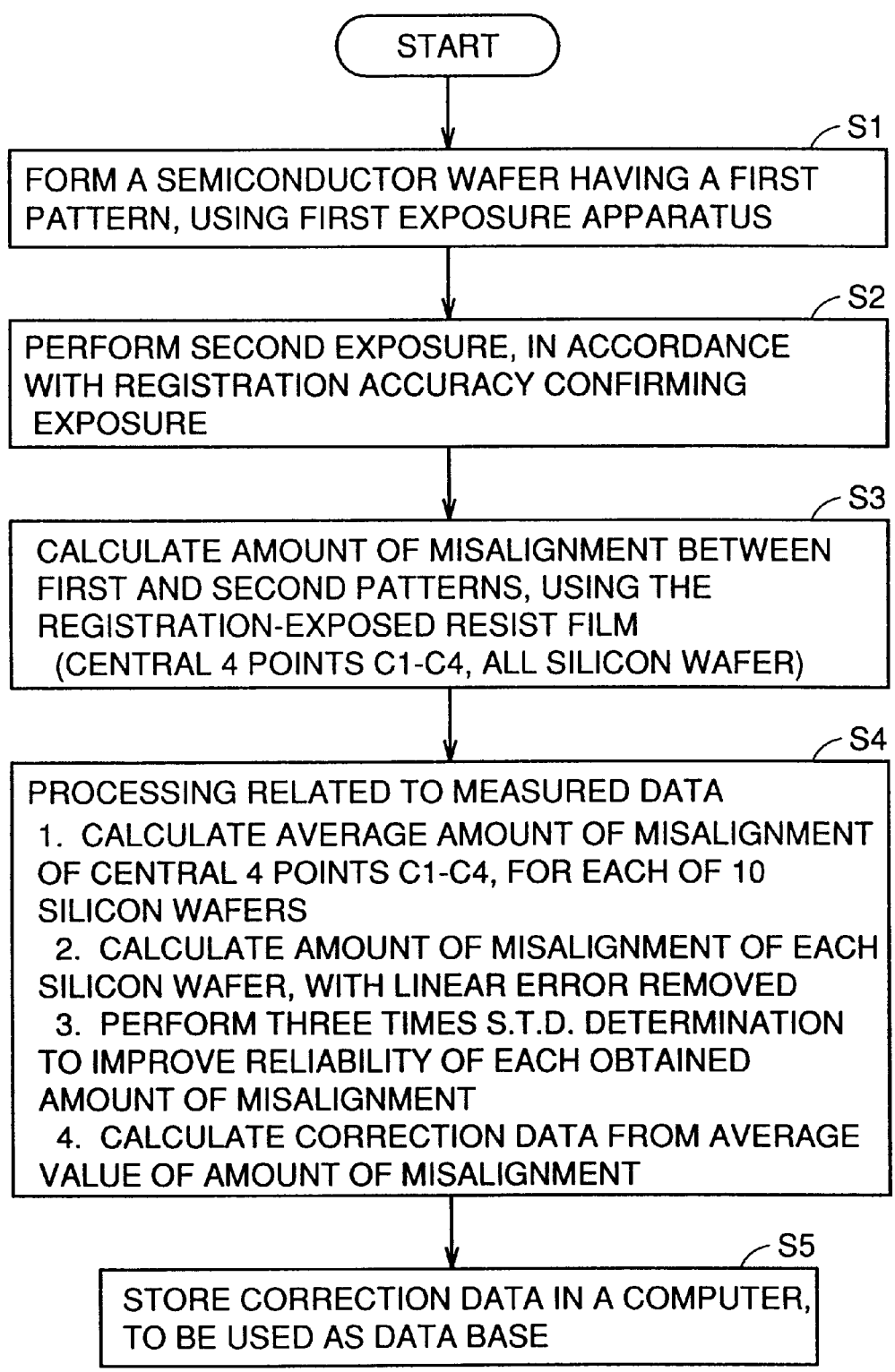
FIG. 7 is a first flow chart representing a method of evaluation in accordance with an embodiment of the present invention.

Finally, an average value of the amounts of misalignment (shot data) obtained from the ten silicon wafers is obtained, and correction data, which is the non-linear error of the first exposure apparatus with respect to the non-linear error of the second exposure apparatus, is calculated (in FIG. 7, step 4).

Figure 8:
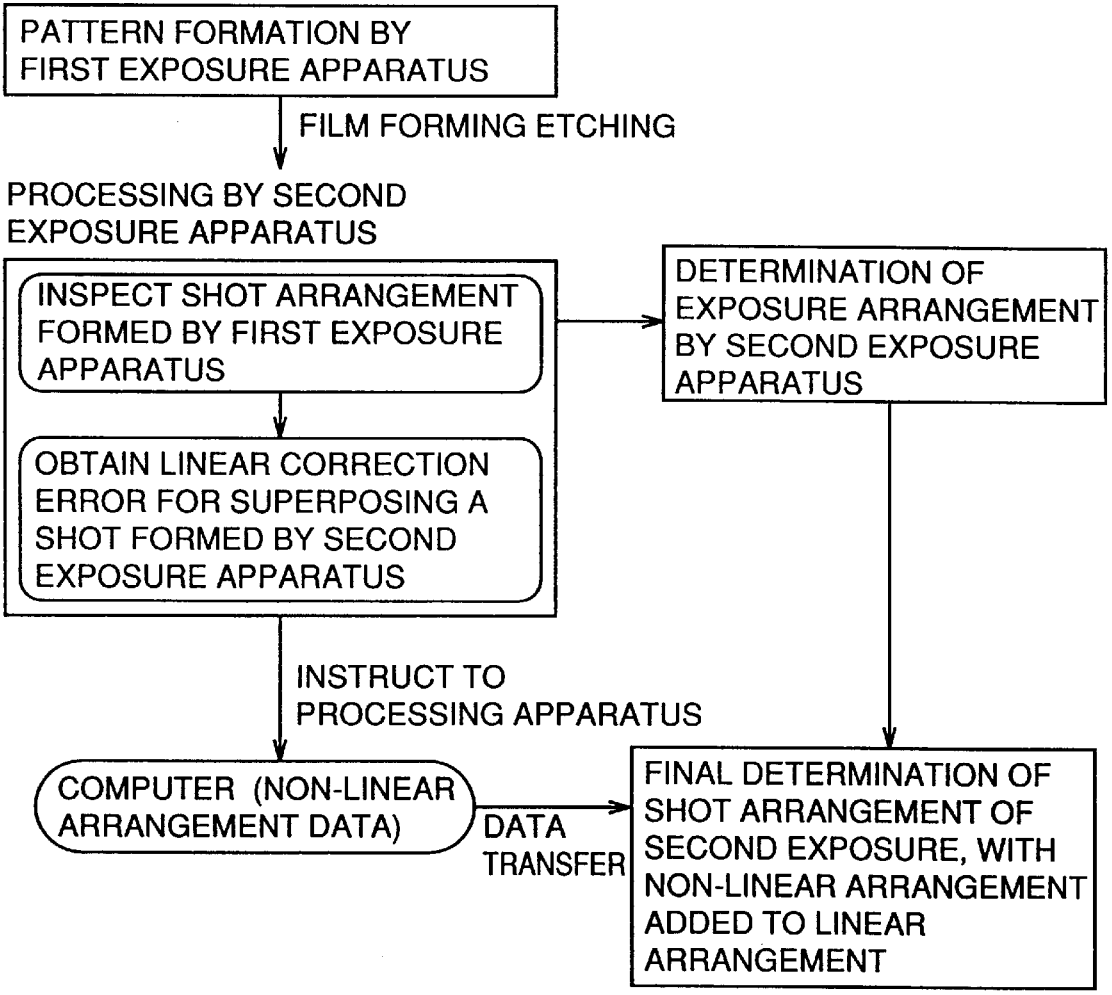
FIG. 8 is a second flow chart representing a method of evaluation in accordance with an embodiment of the present invention.
Figure 9:
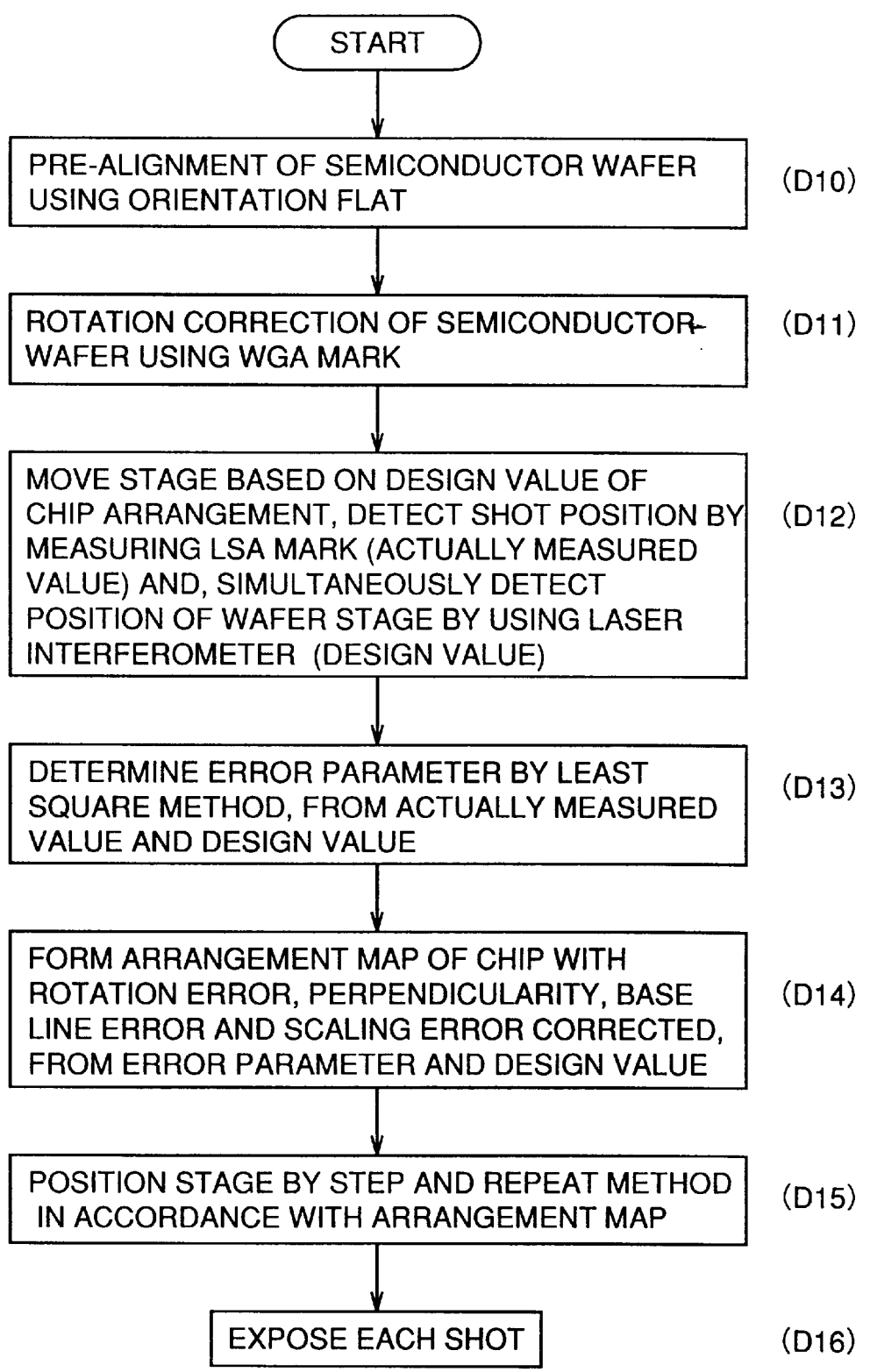
FIG. 9 is a flow chart representing an exposure sequence using EGA method, disclosed in Japanese Patent Laying-Open No. 61-44429.

Through the above described steps, the correction data, which is the non-linear error of the first exposure apparatus with respect to the second exposure apparatus is obtained, and the correction data corresponding to the stage position of the second exposure apparatus is ready. The correction data obtained in this manner is stored in a computer, and used as a data base (in FIG. 7, step 5). The procedure of determining mark arrangement, in which the mark arrangement for non-linear error is added to the mark arrangement including linear error, in the second exposure apparatus based on the correction data above will be described with reference to FIG. 8.

(Processing by the First Exposure Apparatus)

Using the first exposure apparatus, the silicon wafer on which the resist film is formed is exposed, and thus a semiconductor wafer having a resist film with the first pattern formed is provided. Thereafter, the silicon wafer is processed by the second exposure apparatus.

(Processing by the Second Exposure Apparatus)

The silicon wafer processed by the first exposure apparatus is subjected to inspection of a shot arrangement formed by the first exposure apparatus, in the second exposure apparatus. Thereafter, linear error is obtained, so that the second pattern formed by the second exposure apparatus is superposed on the first pattern.

Thereafter, the information combined by the first and second exposure apparatuses is transferred to the computer. Based on the combination of the first and second exposure apparatuses, the shot arrangement error data (correction data) prepared in advance is selected by the computer, and the data is combined with the shot arrangement involving linear error, determined previously. Thus the shot arrangement with the non-linear error added to the linear error of the second exposure apparatus is finally determined.

By utilizing the sequence described above, it is possible to make the non-linear error of the second exposure apparatus equal to the non-linear error of the first exposure apparatus, and therefore it is possible to remove the cause of stage matching error which causes positional deviation.

As a result, it becomes possible to prevent degradation of registration accuracy when a plurality of exposure apparatuses are used. Further, for semiconductor devices manufactured using at least two exposure apparatuses, extensive operation of one exposure apparatus can be avoided, non-operation or idling of other exposure apparatuses can be avoided, possible delay in developing products caused by malfunction or failure of the exposure apparatus can be prevented, significant cost can be reduced when the exposure apparatus is installed in a plant, and the manufacturing cost of the semiconductor devices can be reduced.

Though a method of correction in which the non-linear error b of the second exposure apparatus is made equal to the non-linear error a of the first exposure apparatus has been described as a method of equalizing the non-linear errors of the first and second exposure apparatuses in the embodiment above, a method of correction in which the non-linear error b of the second exposure apparatus and non-linear error a of the first exposure apparatus are both adjusted to be a prescribed non-linear error d may be used.

According to the exposure method, exposure apparatus and the semiconductor device manufactured by using the exposure apparatus in accordance with the present invention, the correction step for making the non-linear error of one exposure apparatus equal to the non-linear error of another exposure apparatus is provided, and therefore even when a plurality of exposure apparatuses are used, the influence of the non-linear error caused among exposure apparatuses can be minimized. Therefore, degradation of registration accuracy when a plurality of exposure apparatuses are used can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An exposure system for manufacturing a semiconductor device, comprising:

a first exposure apparatus;

a second exposure apparatus; and correcting means for making a non-linear error of said second exposure apparatus equal to a non-linear error of said first exposure apparatus.

2. The exposure system according to claim 1, wherein said correcting means includes:

first exposure means using said first exposure apparatus including a reticle having a prescribed exposure pattern for forming a prescribed first pattern on a resist film on a semiconductor substrate, second exposure means using said second exposure apparatus said second exposure means including a second reticle having an exposure pattern identical to the prescribed exposure pattern, for forming a second pattern on said resist film, correction data calculating means for calculating linear error of said first exposure apparatus with respect to the non-linear error of said second exposure apparatus based on error information between patterns obtained from said first and second patterns, and non-linear error correcting means for making the non-linear error of said second exposure apparatus equal to the non-linear error of said first exposure apparatus, based on the information obtained by said correction data calculating means.

3. The exposure system according to claim 2, wherein:

said first exposure means has first shot area exposure means for exposing the first pattern on each of a plurality of shot areas arranged in a matrix of m rows×n columns (where m and n are integers) on the resist film on said semiconductor substrate, said second exposure means has second shot area exposure means for exposing the pattern on each of the plurality of shot areas, and said correction data calculating means includes averaging means for calculating an amount of misalignment between said first and second patterns formed on selected shot areas among the plurality of said shot areas, and averaging said amount of misalignment of each shot area.

4. The exposure system according to claim 3, wherein said averaging means selects four shot areas approximately at the center, of said m×n matrix.

5. A method of exposure used for manufacturing a semiconductor device, comprising:

determining a non-linear error of a first exposure apparatus;

determining a non-linear error of a second exposure apparatus; and a correction step of making the non-linear error of the second exposure apparatus equal to the non-linear error of the first exposure apparatus.

6. The method of exposure according to claim 5, wherein:

said correction step includes the following steps:

a first exposure step of forming a prescribed first pattern on a resist film for a semiconductor substrate, using the first exposure apparatus including a reticle having a prescribed exposure pattern, a second exposure step of forming a second pattern on said resist film having said first pattern, using the first exposure apparatus including said reticle having an exposure pattern identical with the prescribed exposure pattern, a correction data calculating step of calculating the non-linear error of the first exposure apparatus with respect to the non-linear error of the second exposure apparatus, based on error information between patterns obtained from said first and second patterns, and a non-linear error correcting step of making the non-linear error of the exposure apparatus itself equal to the non-linear error of said another exposure apparatus, based on the information obtained in said correction data calculating step.

7. The method of exposure according to claim 6, wherein:

said first exposure step has a first shot area exposure step of exposing the first pattern on each of a plurality of shot areas arranged in a matrix of m rows×n columns (where m and n are integers) on the resist film on the semiconductor substrate, said second exposure step has a second shot area exposure step of exposing the second pattern on each of said plurality of shot areas, and said correction data calculating step includes an averaging step of calculating an amount of misalignment between said first and second patterns formed on shot areas among the selected plurality of said shot areas, and averaging said amount of misalignment of each shot area.

8. The method of exposure according to claim 7, wherein said averaging step selects four shot areas approximately at the center of the m×n matrix.

9. The method of exposure according to claim 7, wherein said first and second patterns are formed on a plurality of shot areas of at least ten semiconductor substrates.

10. A semiconductor device manufactured by an exposure system including at least two exposure apparatuses, wherein:

the semiconductor device is manufactured by using a correcting means of said exposure system for making a non-linear error of a first exposure apparatus equal to a non-linear error of a second exposure apparatus.

* * * * *